United States Patent [19]

Missout

[11] 4,374,359
[45] Feb. 15, 1983

[54] SYSTEM AND METHOD OF SENSING CURRENT IN HIGH VOLTAGE TRANSMISSION LINES UTILIZING THE TRANSMISSION OF DIGITAL INFORMATION BY OPTICAL FIBERS

[75] Inventor: Gilles Missout, Quebec, Canada

[73] Assignee: IREQ—Institut de Recherche de l'Hydro-Quebec, Quebec, Canada

[21] Appl. No.: 82,223

[22] Filed: Oct. 4, 1979

[51] Int. Cl.³ .................... G01R 19/00; G01R 15/04
[52] U.S. Cl. ...................................... 324/96; 324/126
[58] Field of Search .......................... 324/96, 126, 102

[56] References Cited

U.S. PATENT DOCUMENTS 3,461,384  8/1969  Bayati et al. ........................ 324/96
3,952,247  4/1976  Horichi ............................... 324/96
4,034,289  7/1977  Rozylowicz et al. ............... 324/126

Primary Examiner—Ernest F. Karlsen
Attorney, Agent, or Firm—Oblon, Fisher, Spivak, McClelland & Maier

[57] ABSTRACT

A system and a method for sensing and reproducing a measured current value on a high voltage transmission line. An input shunt means senses a current to be measured. A transmitter circuit transmits a sampled current value of the current passing through the shunt means. The transmitter has converter circuits for reproducing a composite output digital coded signal representative of the sample current value. A light transmitting output means is provided for transmission of the composite output digital coded signal on an optical fiber transmission line to a receiver circuit. The receiver circuit has decoding circuit means for decoding and reconstituting the coded signal to a usable form to determine the sampled current value.

17 Claims, 11 Drawing Figures

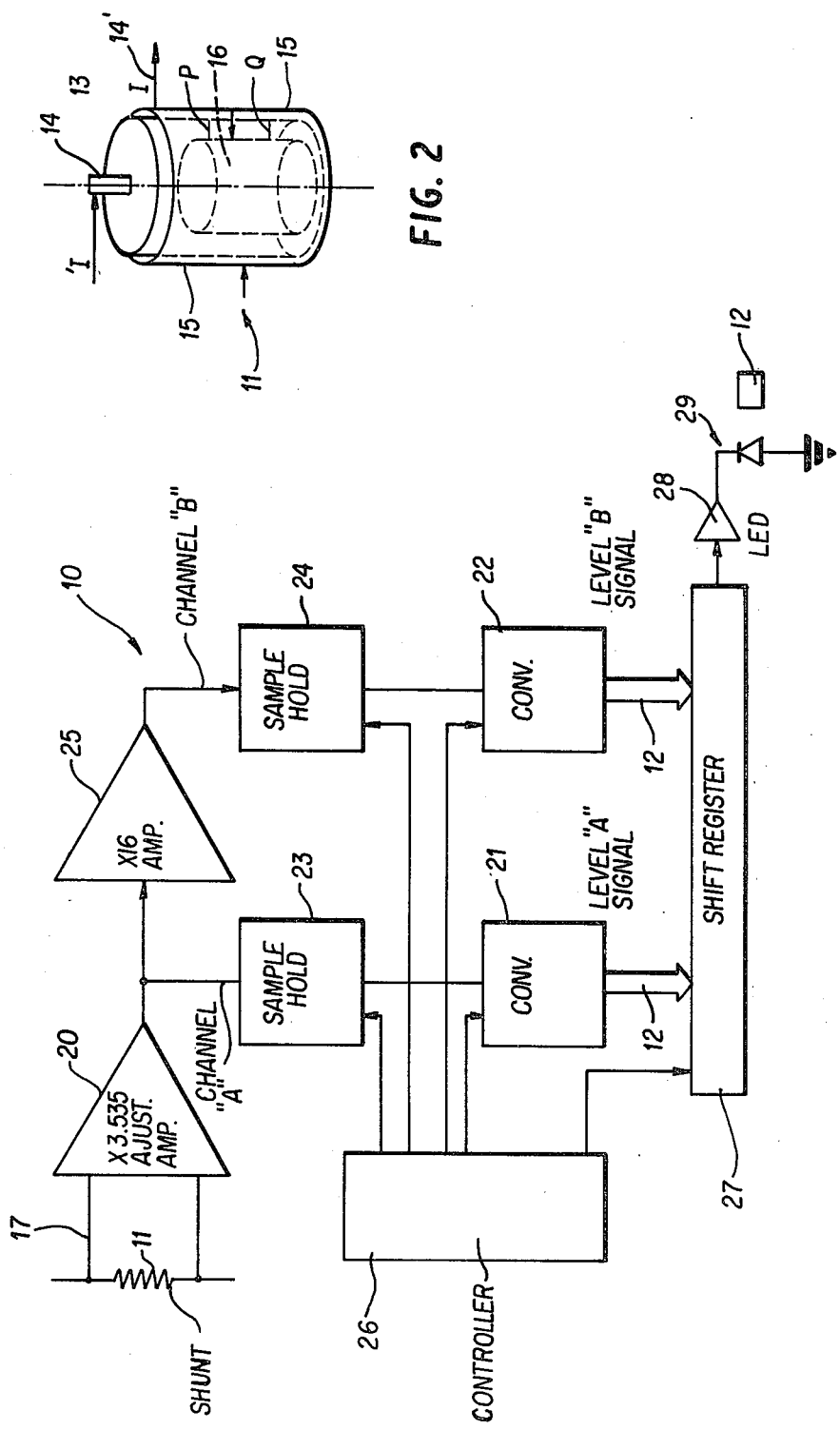

RESPONSE OF SYSTEM
TOP - (IN)
BOTTOM - (OUT)

I = 1000A
VERTICAL 50m/div.
HORIZONTAL 2ms/div.

I = 50A
VERTICAL 5mV/div.
HORIZONTAL 2ms/div.

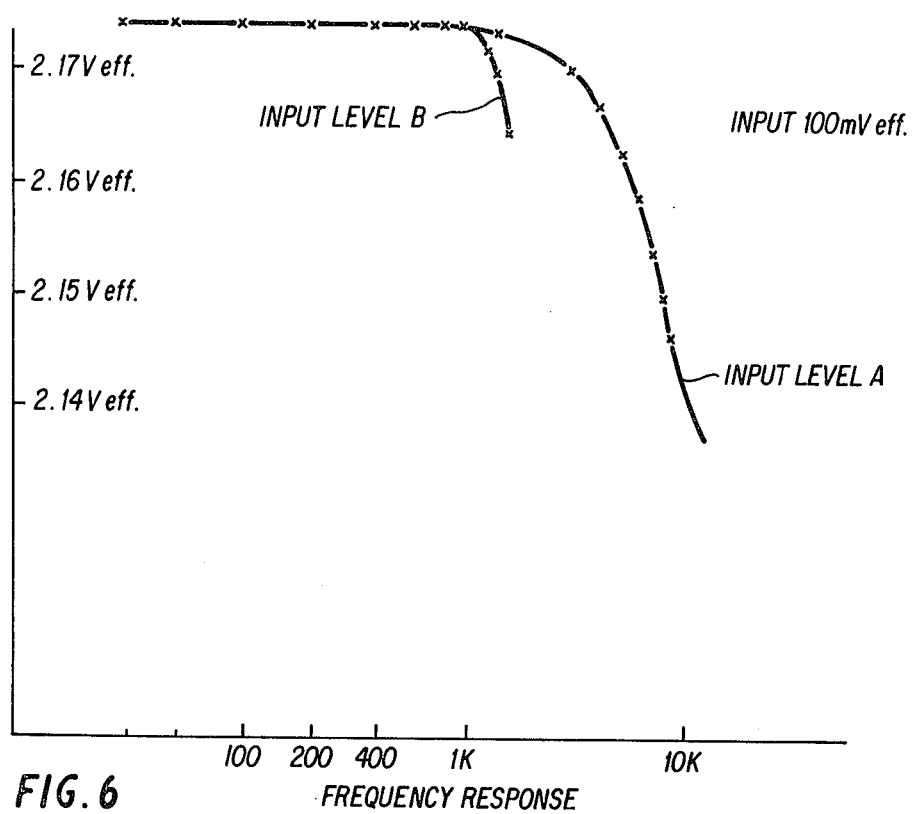
FIG. 6    FREQUENCY RESPONSE
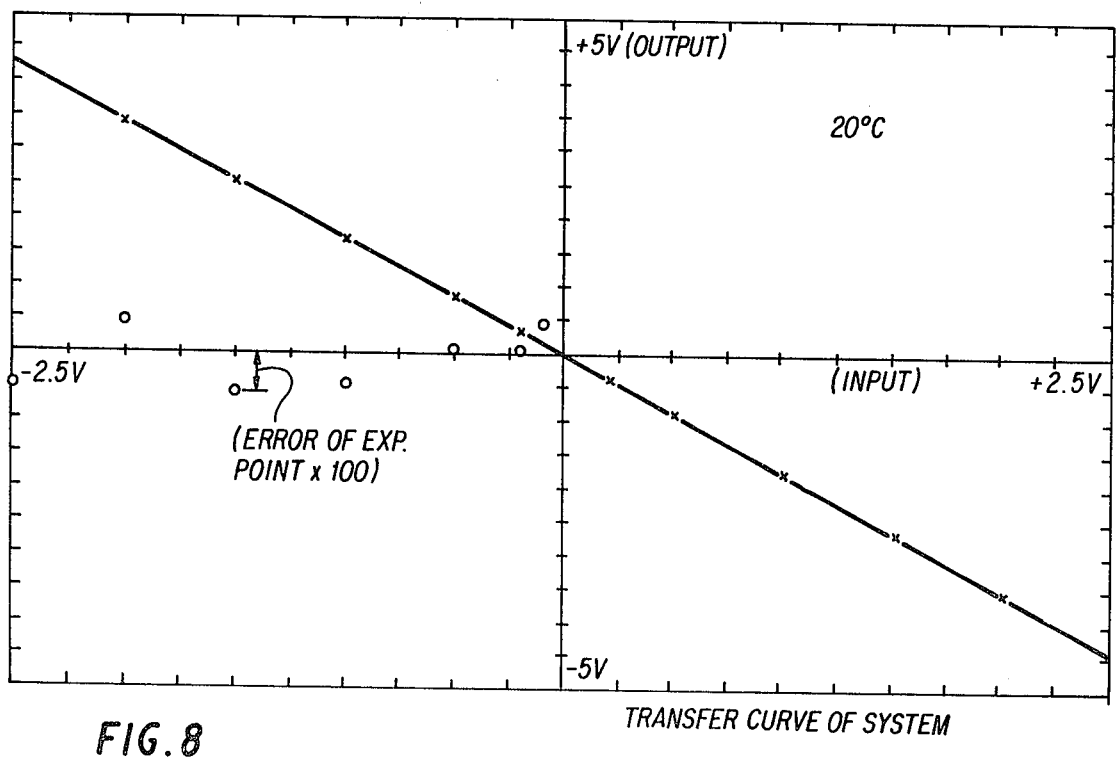
FIG. 8    TRANSFER CURVE OF SYSTEM

GAIN & OFFSET OF THE TWO CHANNELS
AS A FUNCTION OF TEMPERATURE

SYSTEM AND METHOD OF SENSING CURRENT IN HIGH VOLTAGE TRANSMISSION LINES UTILIZING THE TRANSMISSION OF DIGITAL INFORMATION BY OPTICAL FIBERS

BACKGROUND OF INVENTION (a) Field of the Invention

The present invention relates to a system and a method for measuring current in a high voltage transmission line and transmitting the measured values by fiber optics. Particularly, but not exclusively, the measuring may be effected on a continuing basis and at high frequencies.

(b) Statement of the Prior Art

Because of increasing requirements for higher voltages, the transformers used in transmission lines are becoming larger and larger and more expensive to fabricate and install. Furthermore, existing test apparatus are not well isolated from radio frequency interference and thus subjected to noise and are not readily adaptable to computer or microprocessor-type measuring apparatus which are becoming more and more prevalent.

There is, therefore, a need to use more advanced technology in high voltage transmission systems and the present invention is concerned with the utilization of optical fibers to carry transmitted information from a sensor circuit located on a high voltage line. An advantage of using such optical fibers is that they have good voltage isolation qualities and noise immunities. The present invention makes it possible to use low voltage electronic circuits to code information obtained by a sensing circuit and to transmit such information by optical fiber to a receiver circuit where the information is to be used. The use of electronic circuits of this type permits a reduction in the size of the sensing circuit and also permits the use of a shunt to sense the current and further permits the use of a conventional transformer to feed the supplies to the sensing circuit which is adapted at a location on the line.

Various types of sensing circuits have been used on high voltage lines to measure the current, but the majority of such apparatus or circuits utilize modulated coded signals or pulse width modulation.

SUMMARY OF THE INVENTION

A feature of the present invention is to utilize a shunt to obtain a measurement of the current and a converter to provide the measured signal in a form for transmission on an optical fiber transmission line to a far end receiver for analysis of the information.

Another feature of the present invention is to provide a system and a method capable of sensing and measuring current on a high voltage transmission line and on a continuous basis and at high frequencies.

A further feature of the present invention is to provide a system and a method for sensing and measuring current in a high voltage transmission line and providing two or more signals representative of the measured current and converting same for transmission on a optical fiber transmission line and wherein the information is in a form to be utilized by computers and microprocessors.

A further feature of the present invention is that an instantaneous value can be provided when a measured signal is required.

According to the above features, from a broad aspect, the present invention provides a system for sensing and measuring current on a high voltage transmission line. The system comprises an input shunt element connected to the transmission line for sensing a current flowing therethrough. A transmitter circuit is provided for transmitting a signal representative of said current passing through said shunt element. The transmitter has converter means for producing a composite output digital coded signal representative of the value of the measured current. A light transmitting output means is provided for the trnsmission of the coded signal on an optical fiber transmission line to a receiver circuit having decoding circuit means for decoding and reconstituting the coded signal to a usable form to determine the value of the measured current. The shunt element has a resistive conducting core with an internal chamber. The transmitter circuit is contained within the internal chamber to shield the circuitry from electric and magnetic fields produced by the current flowing through the conducting core around the transmitter circuit.

According to a further broad aspect of the present invention, there is provided a method of sensing and measuring current in a high voltage transmission line. A shunt element, having a resistive conducting core is connected to the high voltage transmission line. The shunt element is provided with an internal chamber. A transmitter circuit is located within the internal chamber to shield its circuitry from electric and magnetic fields produced by current flowing through the conducting core around the transmitter circuit. Current flowing through the conducting core is measured and the sampled current value is converted to a composite output digital coded signal. The composite output digital coded signal is transmitted on an optical fiber transmission line in the form of light impulses. The light impulses are received and the composite output digital coded signal is decoded to provide an output signal representative of the value of the measured current.

BRIEF DESCRIPTION OF THE DRAWINGS

The preferred embodiments of the present invention will now be described with reference to an example thereof as illustrated in the accompanying drawings, in which:

FIG. 1 is a block schematic diagram of the converter/transmission circuit,

FIG. 2 is a schematic illustration of the construction of the input shunt,

FIG. 6 is a characteristic curve of the frequency of response of both channels A and B;

FIG. 8 shows a typical characteristic transfer curve of the system,

DESCRIPTION OF PREFERRED EMBODIMENTS

Figure 3:
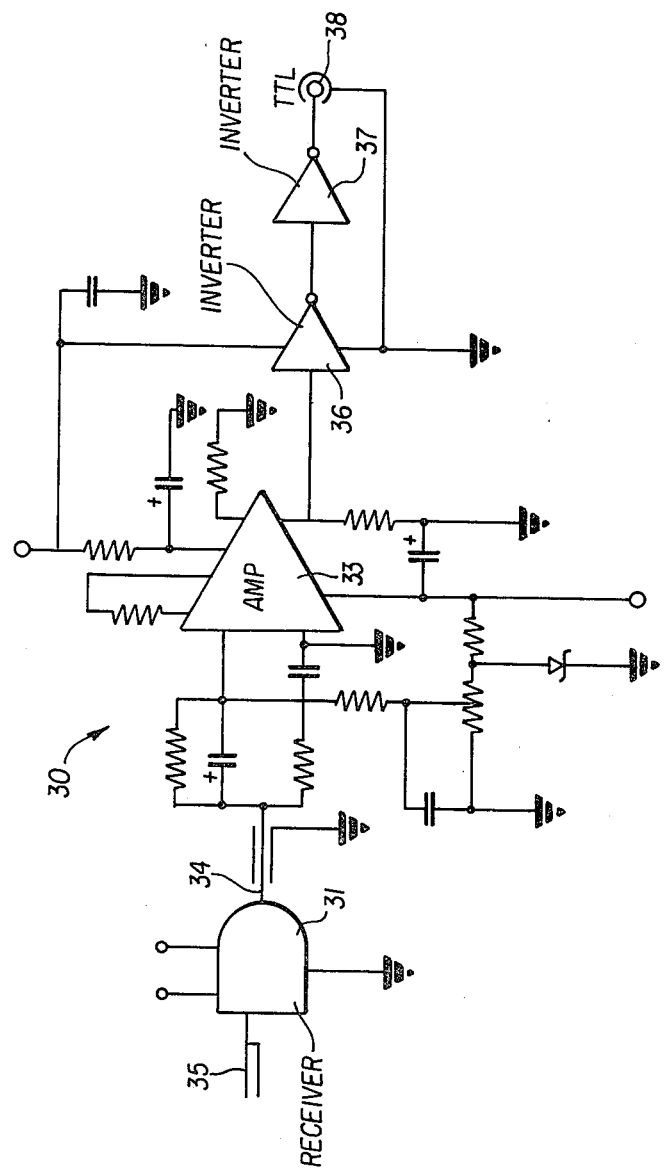
FIG. 3 is a schematic diagram of the analog portion of the receiver.

Referring now to the drawings, and more particularly to FIGS. 1 and 2, there is shown generally at 10 the converter/transmitter which has an input shunt 11. The circuit 10 senses the current passing through the shunt, at two points P and Q, and converts and transmits signal information relating to the measured current on an optical fiber transmission line, herein schematically illustrated at 12, to a remote receiver circuit, which will be described later.

As shown in FIG. 2, the shunt 11 is of a coaxial design comprising an inner resistive conductive tube 13 for conducting current from an input connection 14 down through the tube 13 and upwards on an outer conducting tube 15 to an output connection 14'. The inner resistive tube 13 is provided with an internal chamber 16 which is free of electric and magnetic fields related to the measured current. The converter/transmitter circuit 10 is mounted within the internal chamber 16.

The input connections 17 of the converter/transmitter 10 is connected to the inner resistive tube 13 at the two predetermined connecting points P and Q separated by a known distance, herein 10.50" which gives a resistance value between the points calculated at 45.5μΩ.

This type of coaxial shunt 11 can support continuously a current of 2200 amps (In) and maintain itself within an internal temperature of 125° C. on a fault equal to 20 amps In during six cycles of the 60 Hz (0.1s.). This limit is imposed by the semiconductors utilized.

The response time of such a shunt is given by the relation $$TM = \frac{\sigma \mu h^2}{6}$$

where
h is the thickness of the resistive tube 13 in meters
μ is the permeability in H/m, and
σ is the conductivity in mho/m.
In the present use of such a shunt, we have $$\mu \simeq \mu_O = 4 \, M \times 10^{-7} \text{ (monel K)}$$

$$\sigma = \frac{1}{0.603 \times 10^{-6}} \text{ mho/m}$$

h=0.012 m
Thus, the response time TM=50 μS.
The approximate pass band is given by the relationship $$B = \frac{0.35}{2 \, Tm} = 3500 \text{ Hz}$$

This pass band is superior to the system specification aimed and namely a frequency of 600 Hz.

As previously mentioned, measuring points P and Q (see FIG. 2) on the shunt 11 are 10.50" apart which gives a resistive value of 45.5μΩ, or a voltage of 100 mV for 2200 amps (nominal current).

Because the electronics must operate in an ambient temperature range of between −55° C. to +125° C., and because of the dynamic range to be covered (0.1 In to 20 In) this dictates the use of two analog/digital converters 21 and 22 operating with input signals having a difference in relationship by a factor of sixteen (16) giving two channels A and B.

Referring to FIG. 1, the converter/transmitter 10 comprises a first input amplifier 20 which is utilized to permit simultaneous adjustment of both channels A and B. In the present transmitter design the amplifier 20 has a gain of 3.535 which can permit the measurement and the transmission of a current of 44 kA RMS (20 In) on the first channel A and current of 2.75 kA RMS on the second channel B.

Converters 21 and 22 are each fed by a Sample and Hold circuit 23 and 24, respectively, with the sampling circuit 24 being fed by a second amplifier 25 having an amplification factor of ×16. The Sample and Hold circuit 23 is fed by the output of the first amplifier 20. Also, the Sample and Hold circuits 23 and 24 are each controlled by a controller circuit 26 which provides trigger pulses every 40 μS to the circuits 23 and 24, whereby to obtain a sample of the current value using channels A and B. The controller also feeds control pulses to the converters 21 and 22 and to a shift register 27 which makes a parallel to series conversion. The results of the conversion at the output of each of the converters 21 and 22 is a 12 bit word and these words are combined (24 bits) into a composite output digital coded signal of 31 bits in the register 27. The register 27 adds trigger and control bits in order to eliminate long chains of "0" and "1". There cannot be a series of eight consecutive "0" except between two words (between 31 bit words). The controller 26 can also be adapted to receive a remote control signal to obtain a synchronized sampling when two or more systems are used to measure other currents such as on each line of a 3-phase power line.

The composite output digital coded signal at the output 28 feeds a light-emitting diode 29 of the type Texas Instrument TIXL 472, which transmits light impulses in the fiber optical transmission line 12. Other forms of light transmission devices, such as lasers, may be utilized for this purpose. The transmission line 12 is herein comprised of a bundle of six optical fibers. However, the line could consist of a single fiber or other size of bundle. The controller circuit 26 controls the sampling sequence and the transmission sequence. In specific applications, the sampling is obtained, converted and transmitted every 40 μS. The transmission rate on the optical fiber transmission line is 1 Mbits/second.

The calculated maximum error in the entire converter/transmitter electronic circuit 10 is less than 0.6% of the maximum level value for both channels A and B and this includes all of the errors (i.e., variation of the offset of the gain) and within the temperature range of between −55° C. to +125° C. In practical use, the accuracy of the converter/transmitter is better than 0.6%. A gain resistor (not shown) in the amplifier 20, of a type R-2R, permits a fine adjustment of the gain of that amplifier. This permits the correction of errors in the construction of the shunt. The second amplifier 25 has a fixed gain of ×16. The resistors in both amplifiers are of the thin film type which have a very high stability to temperature change.

Figure 4:
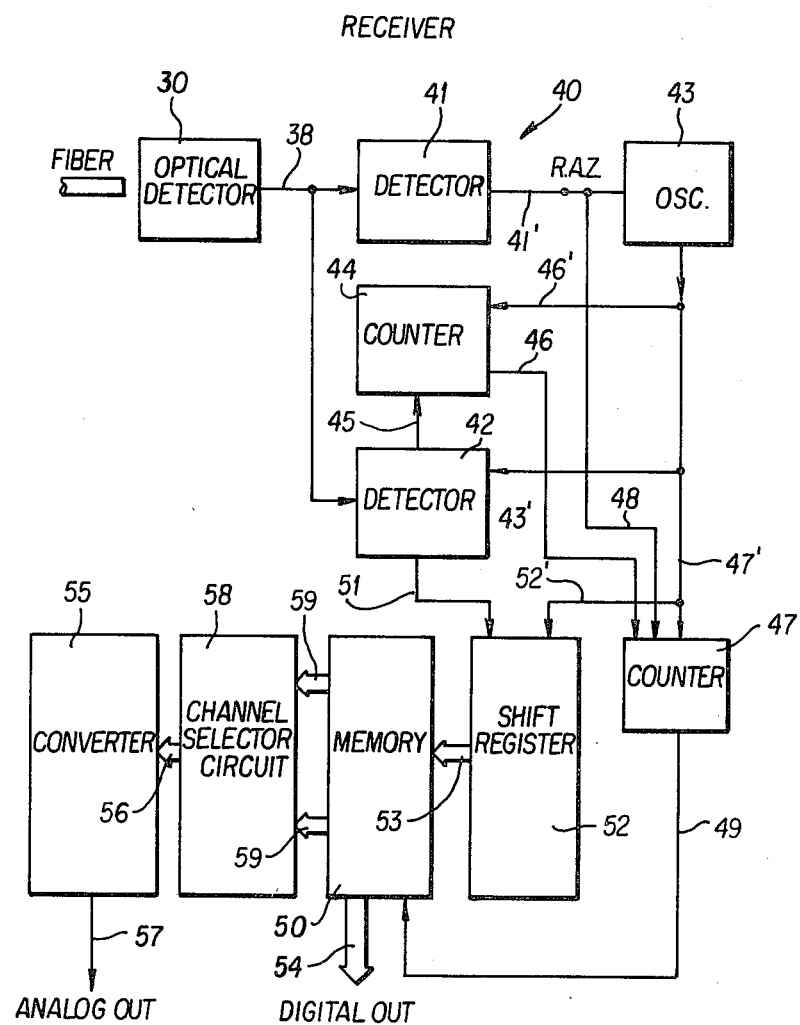
FIG. 4 is a block schematic diagram of the receiver circuit.

Referring now to FIGS. 3 and 4, there is shown the construction of a receiver circuit. FIG. 3 is a schematic of the diode and preamplifier input illustrated by block 30 in FIG. 4, and FIG. 4 is a block diagram of the entire receiver circuit generally indicated by reference numeral 40.

Referring now to FIG. 3, the optical detector input circuit 30 consists of an input receiver 31 using a photoelectric avalanche type Texas Instrument TIXL 452. The band pass (500 MHz) of the diode in circuit 31 is practically limited to 50 MHz by the preamplifier included within the receiver. Such an input circuit is adequate for the present receiver. The amplifier 33 is used to increase the amplitude of the signal at the output 34 of the receiver 31, which receiver is fed by the composite output digital coded signal received on its optical fiber input connection 35. The amplifier 33 permits the adjustment of the mean value of this signal. The amplifier 33 feeds two inverters 36 and 37 which condition the signal to obtain standard TTL levels at the output 38.

Referring now to FIG. 4, the output 38 is connected to two detector circuits 41 and 42 to detect the transition and the code of the digital signal, i.e., (1) or (0). The receiver 40 consists of decoding circuit means for decoding and reconstituting the coded signal at 38 to a usable form to determine the value of the sampled current at the input of the transmitting circuit 10. The decoder receiver 40 utilizes a 20 MHz oscillator in the clock circuit 43. This oscillator gives a 1 MHz clock using a divide by 20 counter(not shown). Thus, the 1 MHz clock has a plurality of outputs all in phase. The transition detector 41 has an output 41' connected to the clock 43 to synchronize and reset the 1 MHz clock in accordance with the received signal and within an error signal smaller than the duration time of a single bit divided by 20. The clock 43 has an output connection 43' which feeds the detector 42 whereby to sample the signal every 0.5 $\mu\delta$ after the instant in which a transition could take place. Thus, sampling occurs in the middle of a bit duration.

A divide by 8 counter 44 is connected to an output 45 of the detector 42 and identifies the separation (at least eight consecutive "0") between the 31 bit composite signals to determine the start of a word to be decoded. The counter 44 has an output 46 feeding control signals to a divide by 31 counter 47. The clock 43 synchronizes counter 44 by feeding clock pulses on its input 46'. The divide by 31 counter 47 is also synchronized to the clock 43 through input connection 47' and further receives the output signal of output 41' of the detector 41 at its input 48. The counter 47 also detects the end of the 31 bit coded signal. The output 49 of the divide by 31 counter 47 feeds the memory circuit 50 to provide the word identification signal thereto whereby it can latch the two 12 bit words representative of the sampled current values at channels A and B of the transmitter 10.

The output 51 of the detector 42 also feeds the input of a shift register circuit 52 which does the series to parallel conversion and is clocked by its input 52'. The output 53 of the shift register 52 transfers the 24 bit information signal (two 12 bit words) to the memory circuit 50. The transfer of the information from the register 52 is done by the memory circuit 50 which is fed with identification signals by the divide by 31 counter 47 after 31 bits have been received. Control bits are also provided to detect errors and to give a "busy" and "data available" signal for use of the output 54.

The memory 50 is provided with two output circuit means one giving a direct digital signal at output 54 which may provide a display of the 24 bits by electroluminescent diodes (not shown). Another output circuit means feeds a digital/analog converter circuit 55 which is a 16 bit converter which permits it to convert an input signal fed on its input 56, and consisting of a 16 bit signal, and to provide an analog output 57 as a voltage with a scale of ±5 volts. A channel-determining circuit 58 is fed by outputs 59 of the memory 50 and it automatically samples the two 12 bit signals to determine if the channel B is saturated thus permitting the circuit 58 to decide which of the two channels is more accurate. Channel B is saturated if the 12 bits are all at "0"(zero) at the transition period of scale A or all at "1"(one). A timing circuit (not shown) permits a return to scale B, a certain period of time after channel B has desaturated, to prevent shifting of the scales at the zero transition of the signal, particularly when the signal is strong. A manual adjustment element (not shown) can also be provided to impose a desired one of the two scales on the converter 55. The output of the receiver thus permits monitoring of the current on the high voltage line for corrective action.

Figure 5:
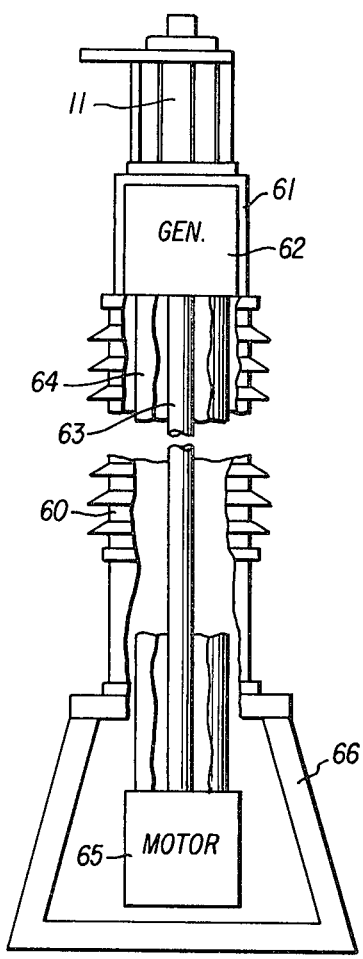
FIG. 5 is a fragmented section view of the mounting assembly.

Referring now to FIG. 5, there is shown a preferred construction of a mounting assembly. As herein shown, the shunt 11 is secured atop an insulating column 60 on top of a generator housing 61. A generator 62 is housed within the housing 61 and driven by an insulated drive shaft 63 which extends through a bore 64 in the column 60. The drive shaft 63 is driven by a motor 65 located in a mounting base 66 of the assembly. The bore 64 has a pressurized gas therein which prevents the ingress of humidity. The motor/generator arrangement (65,62) constitutes a 400 Hz power supply. Two 400 Hz transformer-rectifier-regulator assemblies feed the ±15 volts and the +5 volt power for the operation of the transmitter 10 located in the shunt 11.

Figure 7:
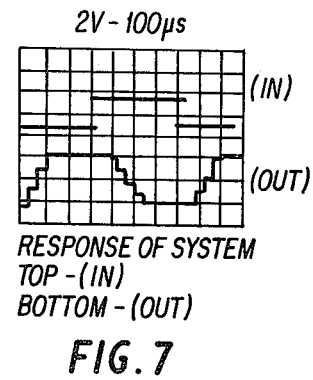
FIG. 7 shows the response of the system when the shunt is replaced by a square wave voltage source.

A prototype has been built and in a first period tested with a voltage source simulating the shunt. FIG. 6 illustrates the pass bands of both channels A and B with a 100 mV input and FIG. 7 illustrates a response curve on a CRT display scale. A series of curves have been traced for each channel in relation to temperature. These curves have been obtained on a point to point basis by feeding a series of constant voltage values at the inputs of the transmitter 10. FIG. 8 illustrates the response curve obtained by this method.

Figure 9:
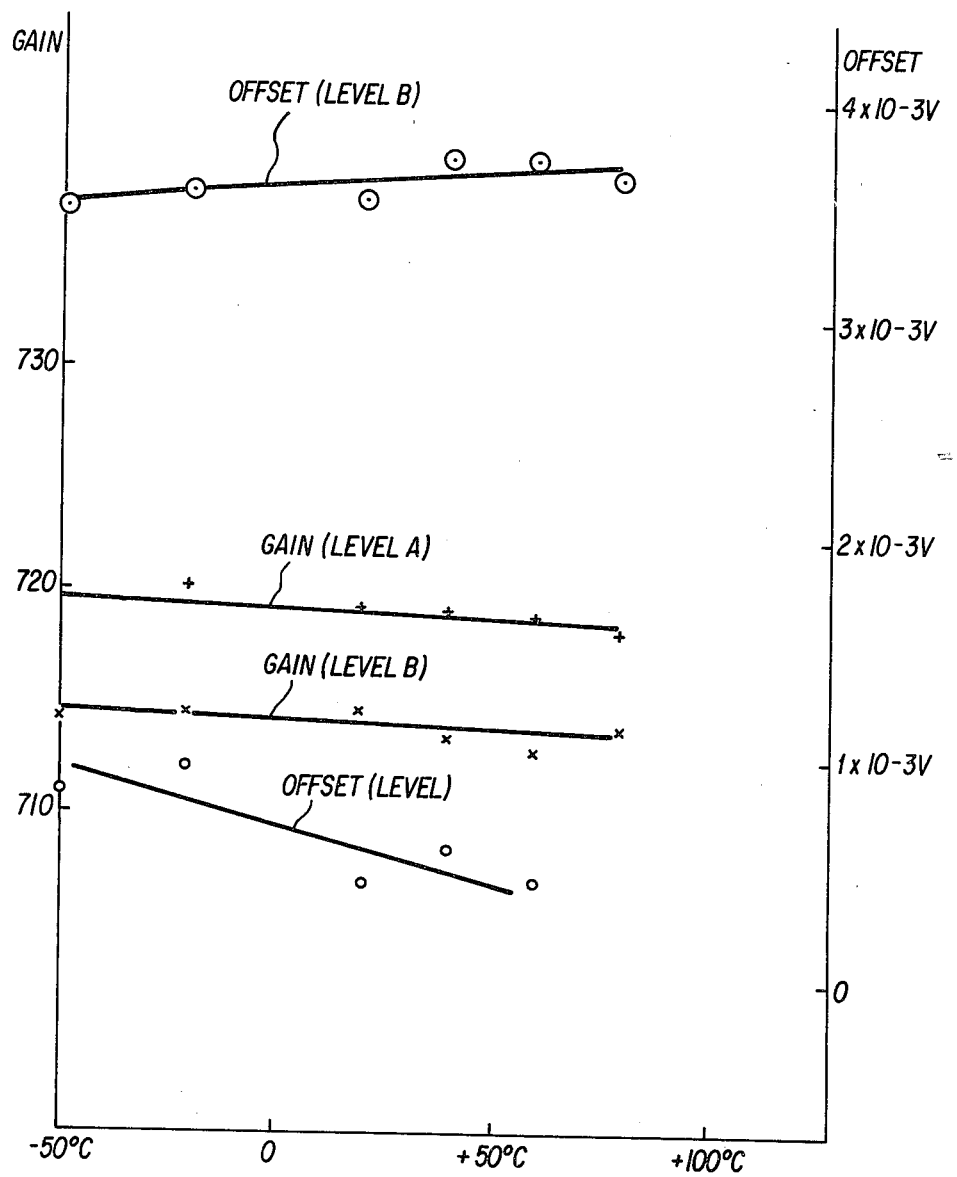
FIG. 9 is a graph illustrating the curves which show the gain and the offset of each of the channels as a function of temperature, and FIGS. 10a and 10b, which appear with FIG. 5, show display curves illustrating the functioning of the system at tests made at 1,000 amps and 50 amps.

Referring to FIG. 9, there is shown a compilation of all the curves which illustrates the gain and the offset of each of the channels at various temperatures. These gains and offsets were obtained by the square means method. FIG. 9 illustrates clearly the improved stability of the gain and the offset for each of the input levels. The curves illustrate a difference of the gain of 0.3% between the two input levels. The difference of the offset was due to a bad adjustment of the transmitter. It is also pointed out that these curves stop at 80° C. After the system was stabilized at 80° C. during a period of one half hour, the temperature was raised to 125° C. during two minutes. This two minute period is sufficient for the test (not to damage the circuit components) and should exceed a practical situation where a fault would occur at maximum voltage during a period of 0.1 second. No damage was made to any of the components of the system. After returning to a temperature of 70° C. the calibration of the system was verified and all was in order.

Figure 10A:
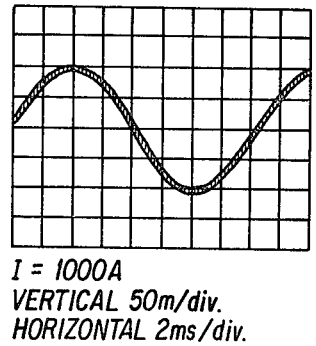
Figure 10B:
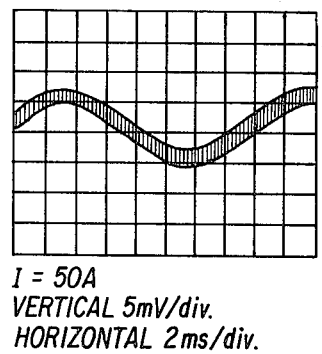

High current tests were also made utilizing a 60 Hz transformer which fed a 2000 amp current through the shunt. It was verified that the current did not affect the electronic circuit located in the shunt by short-circuiting the transmitter input inside the shunt. FIGS. 10a and 10b illustrate measurements taken at high current tests effected between 0 and 2000 amps. FIG. 10a shows the output with a 1000 amp current input, while FIG. 10b shows the output with a 50 amp current input. The apparatus proved operational at these high current values.

It is within the ambit of the present invention to cover any obvious modifications of the example of the preferred embodiment illustrated and described herein. With the method of the present invention, it is conceivable to use the system on high voltage transmission lines of 735 kV. It is also foreseen that new amplifiers with programmable gains could be used and would permit to increase the number of scales to use an analog/digital converter close to its maximum input value. The principal object is to have a very small error on the sensed value of small currents. On the other hand, the phase error is minimized by obtaining many samples at small increments of time. It is apparent that the sampling could be effected, at random, from a command circuit located on the ground. Also, measurement could be synchronously made on the three phases of the same transmission line.

Further, it is conceived that the shunt could be constructed as a non-coaxial shunt with the outer conducting tubes 15 secured behind the inner conductive tube 13, that is to say in series. The electronics of circuit 10 could be housed within the tube 15.

I claim:

1. A system for sensing and measuring current on a high voltage transmission line comprising an input shunt element connected to said transmission line for sensing a current flowing therethrough, a transmitter circuit for transmitting a signal representative of said current passing through said shunt element, said transmitter having converter means for producing a composite output digital coded signal representative of the value of said measured current, a light transmitting output means for transmission of said coded signal on an optical fiber transmission line to a receiver circuit having decoding circuit means for decoding and reconstituting said coded signal to a usable form to determine said value of said measured current, said shunt element having a resistive conducting core with an internal chamber, said transmitter circuit being contained within said internal chamber to shield its circuitry from electric and magnetic fields produced by said current flowing through said conducting core around said transmitter circuit.

2. A system as claimed in claim 1, wherein said light transmitting output means is a light emitting device coupled to optical fibers for transmitting light impulses in said fibers representative of said composite output digital coded signal.

3. A system as claimed in claim 1, wherein said input shunt has two connecting points for passing said current to be measured, said transmitter circuit having two channels each having an analog to digital converter, a first amplifier for adjusting simultaneously both channel levels and feeding a first input signal to one of said converters, a second amplifier connected to an output of said first amplifier to provide an amplified input signal to a second one of said converters.

4. A system as claimed in claim 3, wherein said digital converters each feed a 12 bit signal representative of their input signal to a shift register circuit to effect a parallel to series conversion to provide said composite output digital coded signal, and a control circuit to provide trigger and control pulses to said shift register circuit to provide identification and trigger bits in said composite output digital coded signal and to effect sampling of said current to be measured by said transmitter circuit and at predetermined time limits.

5. A system as claimed in claim 3, wherein said transmission line has one or more optical fibers fed by said light emitting device which is a light emitting diode, said transmission being of the serial asynchronous type carrying said coded signal which is a multi-bit word separated by a predetermined series of known bits.

6. A system as claimed in claim 4 wherein said receiver circuit comprises a photoelectric input diode for receiving said light impulses, a preamplifier to amplify output signals of said input diode, said decoding circuit means reconstituting said coded signal into usable signals representative of said two 12 bit signals.

7. A system as claimed in claim 6, wherein said decoder circuit comprises an oscillator clock circuit operating at a frequency of 20 MHz, a transition detector to synchronize said oscillator clock circuit relative to the start of a received composite signal, said clock circuit enabling sampling said received composite signal in a bit detector in the middle of a bit duration to reproduce said received composite signal, a divide by 31 bit counter enabled by said transition detector to instruct a memory circuit to transfer said two 12 bit coded word signals in said composite signal from a series/parallel converter circuit fed by said bit detector, said memory circuit receiving said two 12 bit coded word signals for processing, said memory circuit having output means to display said received signals.

8. A system as claimed in claim 7, wherein said output means is a direct digital output 24 bit signal to permit display and use of said two 12 bit coded word signals.

9. A system as claimed in claim 8, wherein said output means comprises a digital/analog converter circuit fed by a level selector circuit which receives said two 12 bit coded word signals from said memory circuit and automatically selects a preferred one of said two signals, said digital/analog converter circuit having an output which reconstitutes said selected one of said two signals as an output voltage display on a ±5 volt scale.

10. A system as claimed in claim 1, wherein said shunt is a coaxial cylindrical shunt having an inner conductive tube and a coaxial outer conductive tube, said chamber being defined internally of said inner conductive tube, said inner conductive tube providing voltage signals proportional to said current flowing therethrough.

11. A system as claimed in claim 10, wherein said coaxial shunt is secured on an insulating column and having a driven generator interposed therebetween to provide the required supply voltages to said transmitter, said generator being driven by an insulated drive shaft extending in a bore through said column, and a motor at a base of said column for driving said shaft.

12. A system as claimed in claim 3, wherein said transmission line has one or more optical fibers fed by said light emitting device which is a light emitting diode, said transmission being of the serial synchronous type carrying said coded signal which is a multi-bit word separated by a predetermined series of known bits.

13. A method of sensing and measuring current in a high voltage transmission line comprising the steps of (i) securing a shunt element having a resistive conducting core to said high voltage transmission line, said shunt element having an internal chamber, (ii) locating a transmitter circuit within said internal chamber to shield its circuitry from electric and magnetic fields produced by current flowing through said conducting core around said transmitter circuit, (iii) measuring current flowing through said conducting core, (iv) converting said sampled current value to a composite output digital coded signal, (v) transmitting said composite output digital coded signal on an optical fiber transmission line in the form of light impulses, and (vi) receiving said light impulses and decoding said composite output digital coded signal to provide an output signal representative of the value of said measured current.

14. A method as claimed in claim 13, wherein said sampling is effected by using two or more channels to obtain two or more signal levels, adjusting simultaneously said two or more signal levels by means of a first amplifier to provide a first input signal to constitute a first coded 12 bit word signal.

15. A method as claimed in claim 14, wherein there is further provided the step of multiplying said measured current through a second amplifier having a known multiplication factor to provide a second coded 12 bit word signal whereby said composite output digital coded signal is composed of two 12 bit word signals.

16. A method as claimed in claim 15, wherein there is further provided the step of providing adjustment means to obtain a desired sampling time of said current flowing through said conducting core, and identifying the location of said two 12 bit word signals in said composite output digital coded signal.

17. A method as claimed in claim 13, wherein said step (vi) comprises (a) detecting the start and end of said composite output digital coded signal, (b) transferring said two 12 bit word signals to a memory circuit for processing to provide an output signal reconstituting the value of said sampled current, and (c) selecting a preferred one of said two 12 bit word signals.

* * * * *